(12) United States Patent
Crawford et al.

(10) Patent No.: US 10,080,312 B2
(45) Date of Patent: Sep. 18, 2018

(54) PATCH PANEL FOR QSFP+ CABLE

(71) Applicant: Vapor IO Inc., Austin, TX (US)

(72) Inventors: Colton Malone Crawford, Austin, TX (US); Steven White, Austin, TX (US)

(73) Assignee: Vapor IO Inc., Austin, TX (US)

( * ) Notice: Subject to any disclaimer, the term of this patent is extended or adjusted under 35 U.S.C. 154(b) by 205 days.

(21) Appl. No.: 15/065,224

(22) Filed: Mar. 9, 2016

(65) Prior Publication Data
US 2016/0269233 A1 Sep. 15, 2016

Related U.S. Application Data

(60) Provisional application No. 62/130,018, filed on Mar. 9, 2015, provisional application No. 62/248,788, filed on Oct. 30, 2015, provisional application No. 62/275,909, filed on Jan. 7, 2016.

(51) Int. Cl.
| | |
|---|---|
| *H04L 12/26* | (2006.01) |
| *H05K 7/20* | (2006.01) |
| *G06F 1/30* | (2006.01) |
| *H05K 7/14* | (2006.01) |

(52) U.S. Cl.
CPC ......... *H05K 7/20736* (2013.01); *G06F 1/305* (2013.01); *H05K 7/1492* (2013.01); *H05K 7/1497* (2013.01); *H05K 7/20145* (2013.01); *H05K 7/20745* (2013.01); *H05K 7/20836* (2013.01)

(58) Field of Classification Search
CPC ..... H04Q 1/136; G02B 6/3895; H05K 7/1491
See application file for complete search history.

(56) References Cited

U.S. PATENT DOCUMENTS

| | | | |
|---|---|---|---|
| 8,297,067 B2 | 10/2012 | Keisling et al. | |
| 8,320,125 B1 | 11/2012 | Hamburgen et al. | |
| 8,867,204 B1 | 10/2014 | Gardner | |
| 9,722,381 B1 * | 8/2017 | Moen | H01R 33/88 |
| 2002/0048066 A1 | 4/2002 | Antoniades et al. | |
| 2002/0098792 A1 | 7/2002 | Hsiao | |
| 2002/0149821 A1 * | 10/2002 | Aronson | G01M 11/00 |
| | | | 398/135 |
| 2003/0031449 A1 | 2/2003 | Simmons et al. | |
| 2006/0094291 A1 * | 5/2006 | Caveney | H01R 13/641 |
| | | | 439/540.1 |

(Continued)

OTHER PUBLICATIONS

International Search Report & Written Opinion for Related Application PCT/US2016/021515, dated Jun. 17, 2016, pp. 1 to 13.

(Continued)

*Primary Examiner* — Kevin C Harper
(74) *Attorney, Agent, or Firm* — Pillsbury Winthrop Shaw Pittman LLP

(57) ABSTRACT

Provided is a QSFP+ patch panel, comprising: a circuit board; a plurality of pairs of QSFP+ sockets connected to one another via conductive traces of the circuit board; and one or more microcontrollers coupled to at least two of the conductive traces of each pair of QSFP+ sockets. The one or more microcontrollers comprise memory storing instructions that when executed cause the one or more microcontrollers to perform operations comprising: obtaining configuration settings for the QSFP+ sockets; and configuring connections of the QSFP+ sockets based on the configuration settings.

23 Claims, 3 Drawing Sheets

(56) References Cited

U.S. PATENT DOCUMENTS

| | | | |
|---|---|---|---|
| 2007/0143607 A1* | 6/2007 | McVey | H04L 9/32 713/168 |
| 2007/0258715 A1 | 11/2007 | Androni et al. | |
| 2009/0175195 A1* | 7/2009 | Macauley | H04Q 1/136 370/254 |
| 2009/0251860 A1 | 10/2009 | Belady et al. | |
| 2010/0052863 A1* | 3/2010 | Renfro, Jr. | G02B 6/3878 340/10.4 |
| 2010/0302754 A1* | 12/2010 | Nordin | G02B 6/4452 361/810 |
| 2010/0310225 A1* | 12/2010 | Anderson | G02B 6/4455 385/135 |
| 2012/0103843 A1 | 5/2012 | Wei | |
| 2012/0128507 A1 | 5/2012 | Scheidler | |
| 2012/0321309 A1 | 12/2012 | Barry et al. | |
| 2012/0321310 A1 | 12/2012 | Spock et al. | |
| 2013/0111230 A1* | 5/2013 | Borland | G06F 15/7803 713/300 |
| 2013/0121636 A1* | 5/2013 | Dove | G02B 6/35 385/17 |
| 2013/0133350 A1 | 5/2013 | Reytblat | |
| 2013/0279908 A1 | 10/2013 | Jenkins et al. | |
| 2014/0113539 A1 | 5/2014 | Dickinson et al. | |
| 2014/0137491 A1 | 5/2014 | Somani et al. | |
| 2014/0177163 A1 | 6/2014 | Wiley | |
| 2014/0270762 A1 | 9/2014 | Li et al. | |
| 2016/0013978 A1* | 1/2016 | McLoughlin | H04L 41/083 709/221 |

OTHER PUBLICATIONS

International Search Report & Written Opinion or Related Application PCT/US2016/021521, dated Jun. 20, 2016, pp. 1 to 13.

'Wireless data centers could be faster, cheaper, greener', http://www.news.cornell.edu/stories/2012/09/wireless-data-centers-could-be-faster-cheaper-greener, Sep. 26, 2012, pp. 1 to 2.

'Wild New Design: Data Center in a Silo', http://www.datacenterknowledge.com/archives/2009/12/10/wild-new-design-data-center-in-a-silo/, Dec. 10, 2009, pp. 1 to 6.

'Calcul gets creative with data center cooling design', http://searchdatacentertechtarget.com/photostory/2240169084/New-book-takes-you-inside-unique-energy-efficient-data-centers/3/Calcul-gets-creative-with-data-center-cooling-design, Oct. 23, 2012, pp. 1 to 3.

* cited by examiner

PATCH PANEL FOR QSFP+ CABLE

CROSS-REFERENCE TO RELATED APPLICATIONS

The present application claims the benefit of the following U.S. Provisional patent applications: U.S. 62/130,018, filed 9 Mar. 2015; U.S. 62/248,788, filed 30 Oct. 2015; and U.S. 62/275,909, filed 7 Jan. 2016. The entire content of each parent application is incorporated by reference in its entirety.

BACKGROUND

1. Field

The present invention relates generally to computing equipment and, more specifically to patch panels for QSFP+ cable.

2. Description of the Related Art

In data centers, patch panels are devices in a server rack or a data center with an array of data sockets that can be connected in various combinations. Generally patch panels are used to connect and route circuits (e.g., electrical, optical, or both) to facilitate monitoring, interconnecting, and testing of computing devices in a convenient manner, by positioning a relatively large number of connections in close proximity (e.g., in two or more rows). Patch panels in typical data center use cases have RJ45 connections.

In recent years, the data center industry has begun moving towards high speed data transmission (e.g., 10 Gbs, 40 Gbs, and 100 Gbs). RJ45 connections often do no support these data rates without expensive and cumbersome duplication of cabling to provide parallel data paths. Accordingly, there is a need for higher speed and more configurable patch panels.

SUMMARY

The following is a non-exhaustive listing of some aspects of the present techniques. These and other aspects are described in the following disclosure.

Some aspects include a QSFP+ patch panel, comprising: a circuit board; a plurality of pairs of QSFP+ sockets connected to one another via conductive traces of the circuit board; and one or more microcontrollers coupled to at least two of the conductive traces of each pair of QSFP+ sockets. The one or more microcontrollers comprise memory storing instructions that when executed cause the one or more microcontrollers to perform operations comprising: obtaining configuration settings for the QSFP+ sockets; and configuring connections of the QSFP+ sockets based on the configuration settings.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
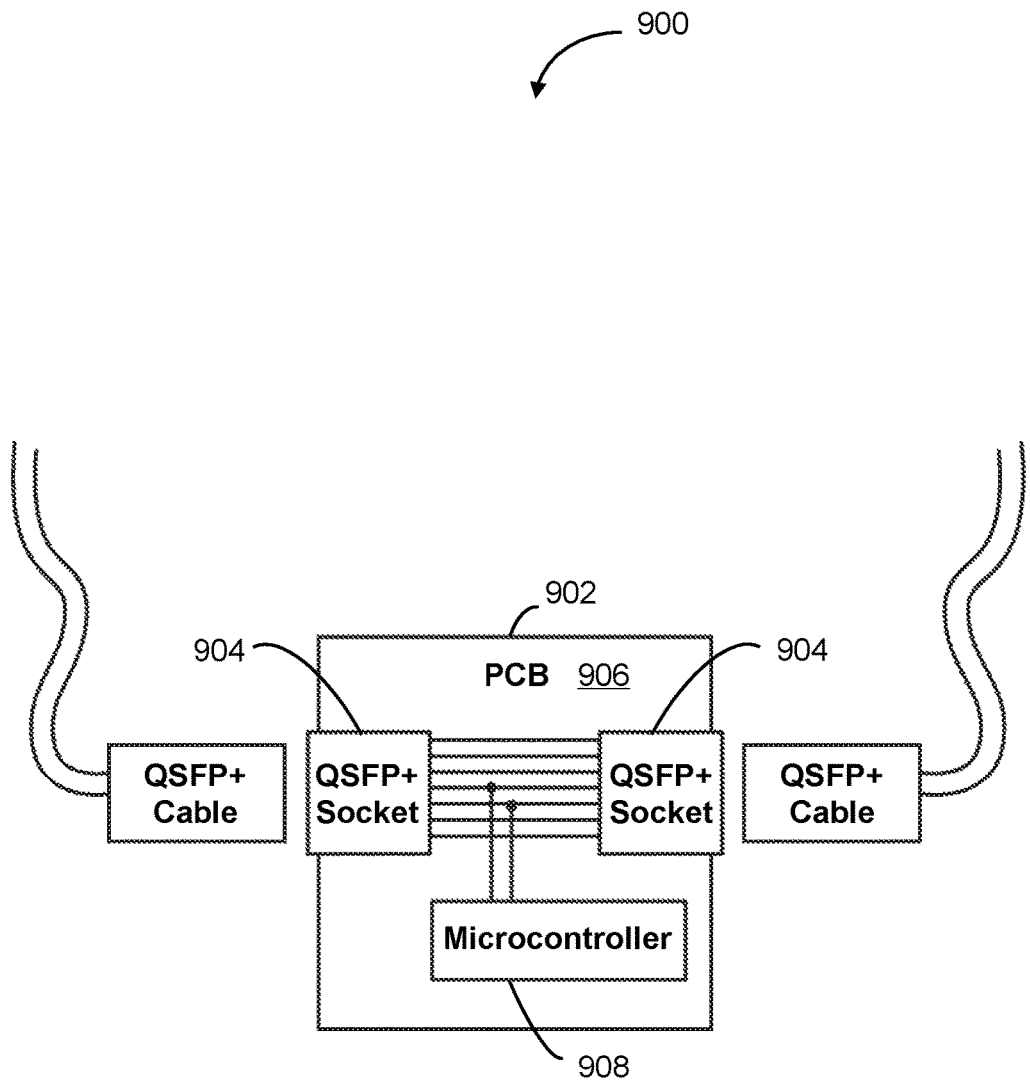
FIG. 1 illustrates an example of a QSFP+ patch panel, in accordance with some embodiments.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of data center design. Indeed, the inventors wish to emphasize the difficulty of recognizing those problems that are nascent and will become much more apparent in the future should trends in the data center industry continue as applicants expect. Further, because multiple problems are addressed, it should be understood that some embodiments are problem-specific, and not all embodiments address every problem with traditional systems described herein or provide every benefit described herein. That said, improvements that solve various permutations of these problems are described below.

Figure 2:
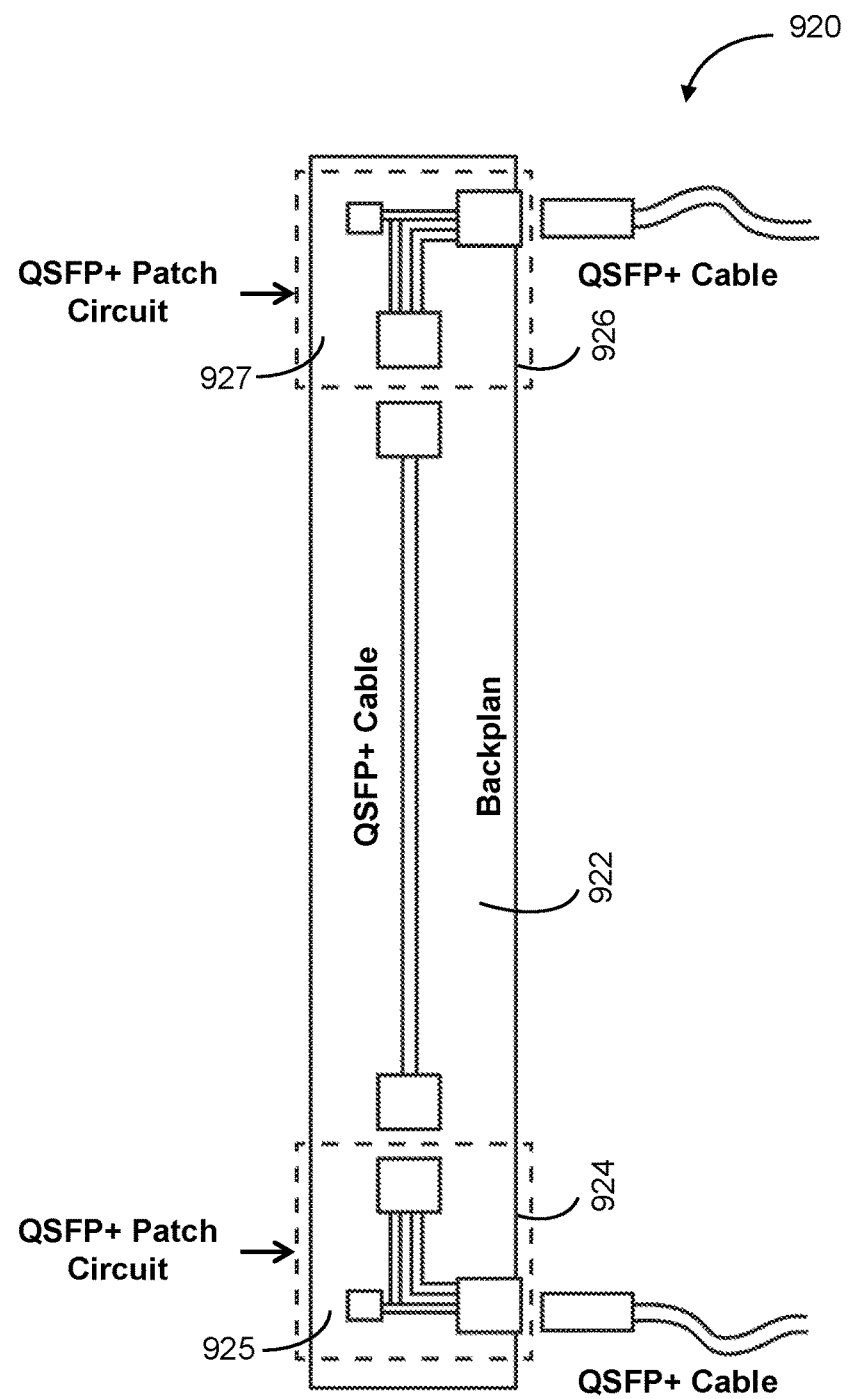
FIG. 2 illustrates a QSFP+ patch panel, in accordance with some embodiments.

Some of the above-mentioned issues may be addressed with a quad (4-channel) small form-factor pluggable plus (QSFP+) patch panel illustrated in FIGS. 1 and 2. In some cases, a microcontroller in the panel may configure the QSFP+ connections, performing the role typically filled by a network switch with traditional deployments of QSFP+ cables, thereby permitting these cables to be used in the patch panel context. The QSFP+ connections are expected to support substantially higher data rates and offer greater configurability than traditional patch panels with RJ45 connections.

QSFP+ connections are based on a relatively compact transceiver (e.g., an optical transceiver having a laser and optical sensor) used in data communications applications. QSFP+ transceivers may include both a transmitter and a receiver that are combined and share common circuitry or a single housing. QSFP+ transceivers may be hot-pluggable transceivers that may allow for the addition of components to the system without significant interruption to the operation of the system (for example, once the appropriate software is installed on the device, a user can plug and unplug the component without rebooting).

Generally, a QSFP+ transceiver interfaces networking devices to a fiber optic cable or to an active or passive electrical copper connection. QSFP+ transceivers provide relatively high bandwidth comparing to other technologies. For example, a QSFP+ transceiver may allow for high data transmission rates (e.g., 10, 40, or 100 Gbit/s). The QSFP+ specification accommodates a plurality of communications standards with different data rates (e.g., Ethernet, Fibre Channel, InfiniBand, or Synchronous Optical Networking and Synchronous Digital Hierarchy (SONET/SDH) standards).

In some embodiments, a QSFP+ patch panel circuit (FIGS. 1 and 2) may be configured for QSFP+ cabling and networking for a functionally transparent connection between devices. A plurality of instances of the circuit 902 may be arranged in spaced relation (e.g., in two or more rows of more than 4 circuits each) to form a patch panel, which may be disposed in one of the racks described in the provisional patent applications incorporated by reference to implement the connectivity described therein, e.g., to form in-band data networks within a rack or between racks. The QSFP+ patch panel may allow for a more organized rack wiring, cable management, and faster connections to equipment, relative to systems using RJ45 connectors. That said, embodiments are not limited to systems that provide these benefits, as various independently useful techniques are described here, which is not to suggest that any other feature may not be omitted in some cases.

FIG. 1 illustrates an example of a QSFP+ patch panel circuit 900. QSFP+ patch panel circuit 900 includes two QSFP+ sockets 904 connected to a PCB (printed circuit board) 906 (FIGS. 1 and 2 are for illustration purposes only, and it should be noted that the patch panel may include a plurality of QSFP+ sockets, in some cases, arrayed next to one another in a panel configured to fit into a one or two "U"s of a rack). In some embodiments, the orientations of the connectors can be straight through or at a right angle to one another (e.g., FIG. 2). In some embodiments, QSFP+ patch panel 900 may connect and route data signals between computing devices, e.g., signals sent for monitoring, processing data, interconnecting, troubleshooting and testing in a more convenient manner. In some embodiments, the patch panel may include a plurality of socket rows. In some cases, one or more rows may have dedicated wiring at the rear of the patch panel to outputs (e.g., top socket rows). In some embodiments, one or more rows may have dedicated wiring to inputs (e.g., bottom socket rows).

In some embodiments, circuit 902 may configure and monitor the QSFP+ connections. For example, PCB 906 may include a microcontroller 908 configured to perform some functionality traditionally provided by network switches connected to QSFP+ cables. For instance, some QSFP+ ports can operate as either 40 Gigabit Ethernet or 4×10 Gigabit Ethernet ports, and the microcontroller may specify a mode for the port in the context of the patch panel. In some cases, the microcontroller may convert the QSFP port from a 4×10 Gbps (gigabits/second) QSFP port to a 1×40 Gbps QSFP port, or the microcontroller may convert the QSFP port from a 1×40 Gb QSFP port to a 4×10 Gb QSFP port. Further, in some embodiments, the microcontroller may be operative to verify that ports in a specified mode are available.

In some embodiments, the microcontroller may configure the QSFP+ responsive to various signals. For instance, a remote command, such as from a system administrator operative a computing device over a network, may instruct the microcontroller to implement or verify a particular configuration. In another example, jumpers or switches on the PCB may specify a configuration to the microcontroller, which may take responsive action. In some cases, commands may be mediated a rack control unit like that described in the documents incorporated by reference, e.g., via commands sent over a direct current (DC) powerline modem.

In some embodiments, the microcontroller 908 is operative to query and command a digital diagnostic monitoring interface (DDMI) of transceivers forming the connections, such as optical transceivers. In some cases, the microcontroller 908 may poll device operating parameters, alarms, and warning flags, and in response to detecting an alarm or flag, transmit a corresponding message (e.g., an interrupt or API request) to a rack controller or data center monitoring station. In some cases, the microcontroller may determine whether operating parameters are outside of a range, like a predetermined range, and in response to exceeding the range, transmit an alert. In some cases, the transceiver may be accessed by the microcontroller 908 via a two-wire bus using the I2C protocol. In some cases, the transceiver may have a 256-byte memory map in an EEPROM at a specified address range, and the microcontroller may (e.g., periodically or in response to a remote command) retrieve values from this allocated memory to monitor the operation of transceivers. Further, in some cases, registers in this range may be written to reconfigure or monitor the transceiver.

In some embodiments, the microcontroller 908 is a relatively low power microcontroller operative to be powered by power provided to the QSFP+ cables. For instance, in some embodiments, the microcontroller 908 is powered by a 3.3 volt power supply. In some cases, the power is delivered via a 12 volt DC power bus that also places the microcontroller 908 in communication with a rack controller.

Additional or alternatively, in some embodiments, the microcontroller may receive, process and forward data to a destination device through a specific port (instead of broadcasting the same data out of each of its ports). In some embodiments, microcontroller 908 may detect cable insertions and then, in response, program the cable behavior appropriately. In some cases, microcontroller 908 may be configured to control the patch panel ports such that each port can transfer data to any of the other ports at a time without causing transmission interference. In some embodiments, the microcontroller may be configured to control the patch panel ports (sockets 904) such that each port can only either receive from or transmit to its connected device at a certain time. In some embodiments, the microcontroller may be configured to control the patch panel ports 904 such that each port may simultaneously transmit and receive (full duplex mode). In some embodiments, transceivers in each socket 904 may digitize analog readings indicative of operation and write the digital values to corresponding designated memory addresses accessible by the microcontroller 908 via an I2C connection.

Examples of the types of values in the transceiver EEPROM registers that may be read or written by the microcontroller 908 include the following: serial ID, vendor specific identifier values, alarms and warning thresholds, calibration constants, diagnostic values, password values, and control function codes. Among other parameters, transceiver temperature, supply voltage, transmit bias current, transmit output power, receiver optical power and the like may be sensed, digitized, and written to EEPROM registers accessible to the microcontroller 908, which may monitor these values, compare them to thresholds, and transmit alarms in the event that thresholds are exceeded. In some case, in response to a jumper or remote control setting being in a particular configuration (like 1×40 Gbps or 4×10 Gbps connections), corresponding values in the EEPROM registers may be written.

In some embodiments, microcontroller 908 may be configured to provide traffic monitoring for security or performance reasons. For example, microcontroller 908 may provide port mirroring by sending a copy of packets sent (or received) through the port to a monitoring device. This may help with error detection and data analysis. Operations of the patch panel and microcontroller 908 may be managed locally (e.g., through a series of jumpers, a bank of dual in-line package (DIP) switches a local interface) or remotely from a remote interface, remote console or a web interface for example. Management of the patch panel and the microcontroller may include port mirroring configuration, port bandwidth configuration, security configuration, priority configuration, or other configurations. In some cases, management of the patch panel and the microcontroller may include modifying, updating, restoring existing configurations. In some embodiments, a remote rack controller may receive a signal indicate a rate of packet loss (or error correction consumption) exceeds a threshold and instruct the microcontroller 908 to increase an optical transmit power or adjust a receive gain, and the microcontroller 908 may make the adjustment until a threshold for temperature is exceeded, at which point the microcontroller 908 may lower the transmit power in response. In some embodiments, the microcontroller 908 may receive a remote command indicative of attributes of a QSFP+ cable connected to a respective socket, like length or supported data rates, and the microcontroller 908 may set a corresponding value in EEPROM memory of a transceiver to calibrate the transceiver to the cable.

In some cases, the microcontroller 908 may coordinate the operation of both sockets. For instance, the microcontroller 908 may monitor a data ready bar register of one socket connection to ascertain whether the corresponding transceiver has powered-up and is ready for data. In response to detecting this state, the microcontroller 908 may change a transmit disable state of a transceiver associated with the other socket to enable transmit.

To communicate, in some embodiments, the microcontroller 908 may connect to transceivers via two wires, e.g., a serial data line and a clock line. With data conveyed via these connections, the microcontroller 908 may monitor operation of transceivers, like optical transceivers, e.g., by polling registers and, in some cases, generating interrupts for other devices upon various conditions obtaining, like alarms upon thresholds being exceeded. Some embodiments may monitor the operating environment, detect and isolate faults, and predict failures. Corresponding alerts may be sent to a rack controller or other host system. In some cases, the rack controller may take responsive action, like increasing a fan speed in response to temperature threshold being exceeded. Or predicted or detected faults may be sent to the rack controller or other host system along with an identifier of the failing component (and in some cases a location) to expedite troubleshooting of network failures. Predictions, in some cases, can be based on readings exceeding thresholds, or values may be integrated or trends may be detected, such as a cumulative change in laser bias over some time exceeding a threshold and indicating drift and possible failure in the future.

In some cases, the EEPROMs associated with the transceivers may have an address space reserved for customer usage, and the microcontroller 908 may read or write values in this space for various purposes. For instance, in some embodiments, inventory identifiers may be written to this space, and the microcontroller may report to a rack controller or other host which transceivers are connected where. In some cases, a mapping of a set of connections on a patch panel may be constructed at a rack controller by a set of microcontrollers 908 reading and reporting such values back to the controller/host.

In another example, usage may be tracked to schedule preventative maintenance. For instance, the microcontrollers 908 may periodically increment or decrement a counter stored in this space to track usage for preventative maintenance. Or a date-deployed value may be written to this space and remotely queried via the microcontrollers 908 for similar purposes. In some cases, parameters read from sensors of the transceiver, like transmit power of biases, may be written to this address space, and the microcontroller later read these values and compare them to current readings from updated registers elsewhere in the EEPROM address space to determine whether drift of these parameters exceeds a threshold, causing the microcontroller 908 to emit an alarm or interrupt.

In some embodiments, PCB 906 may to include a ground plane to reduce electrical noise, interference and to prevent crosstalk between adjacent circuit traces. For example, where multiple traces on the PCB are parallel electrical signals from the traces may be coupled to one another through electromagnetic induction. The ground plane layer may form a transmission line with the trace which helps confines most of the electromagnetic fields to the area near the trace and help prevent crosstalk. In some embodiments, a power plane may be used to distribute DC power to the active devices.

In some embodiments, patch panel circuit 902 may include a plurality of PCBs and microcontrollers each PCB and microcontroller dedicated to a pair of ports, or in some embodiments, a single microcontroller may service a plurality of pairs of ports. In some embodiments, the patch panel circuit 902 includes one or more PCBs and microcontrollers configured to connect and control all the ports in the patch panel. In some embodiments, one or more pairs of ports 904 may be connected through a QSFP+ cable.

FIG. 2 illustrates an example of a pair of ports 924 and 926 connected through QSFP+ cable 922 in a segment of a patch panel, which may include an array of the depicted structures with cabling therebetween. In this example, port 924 includes circuitry 925 (that includes a PCB and a microcontroller) and port 926 includes circuitry 927 (that includes a PCB and a microcontroller). This form of connection (through a QSFP+ cable) may create a high speed backplane. This may allow use of the active transceivers inside the QSFP+ cable to compensate for loss over the long distance, which may be advantageous in some cases due to the lack of long unshielded runs of traces on the PCB. That said, embodiments are not limited to systems that provide these benefits, as various independently useful techniques are described here, which is not to suggest that any other feature may not be omitted in some cases.

QSFP+ transceivers are generally hot swappable, the use of a QSFP+ patch panel may preserve this functionality of the QSFP+ transceivers. In some embodiments, a QSFP+ patch panel may allow for replacing, adding or removing devices without significant interruption to or shutdown of other devices. In some embodiments, where configuration of the devices connected to the patch panel needs to be changed, corresponding QSFP+ cables may be disconnected without significant interruption to operations of the devices. In some embodiments, hot-swapping devices connected to the patch panel may allow for repair, upgrade, and replacement of these devices without significant interruption to the rest of devices connected to the patch panel. In some embodiments, devices connected through the QSFP+ cables may need specific software to be able to be connected and disconnected without interruption. In some cases, only devices that allow hot-swapping may be hot-swapped even if they are connected to the patch panel through a QSFP+ cable. In some embodiments, the patch panel may allow for adding devices without interrupting the rest of the devices connected to the patch panel (e.g., adding a computing device, a monitor, a power source, peripherals, or other equipment).

In datacenter environments, cables can easily become tangled, difficult to identify or unplugged. In some embodiments, the QSFP+ patch panel may allow for a better cable management, easy connection and access to different devices (for example on a server rack), and easy maintenance of the cable system. In operation, QSFP+ cables may need to removed, added, replaced multiple times. The QSFP+ patch panel may allow for an easier way for these types of cables to be organized in a way that prevents crosstalk or interference in some cases. That said, embodiments are not limited to systems that provide these benefits, as various independently useful techniques are described here, which is not to suggest that any other feature may not be omitted in some cases.

Figure 3:
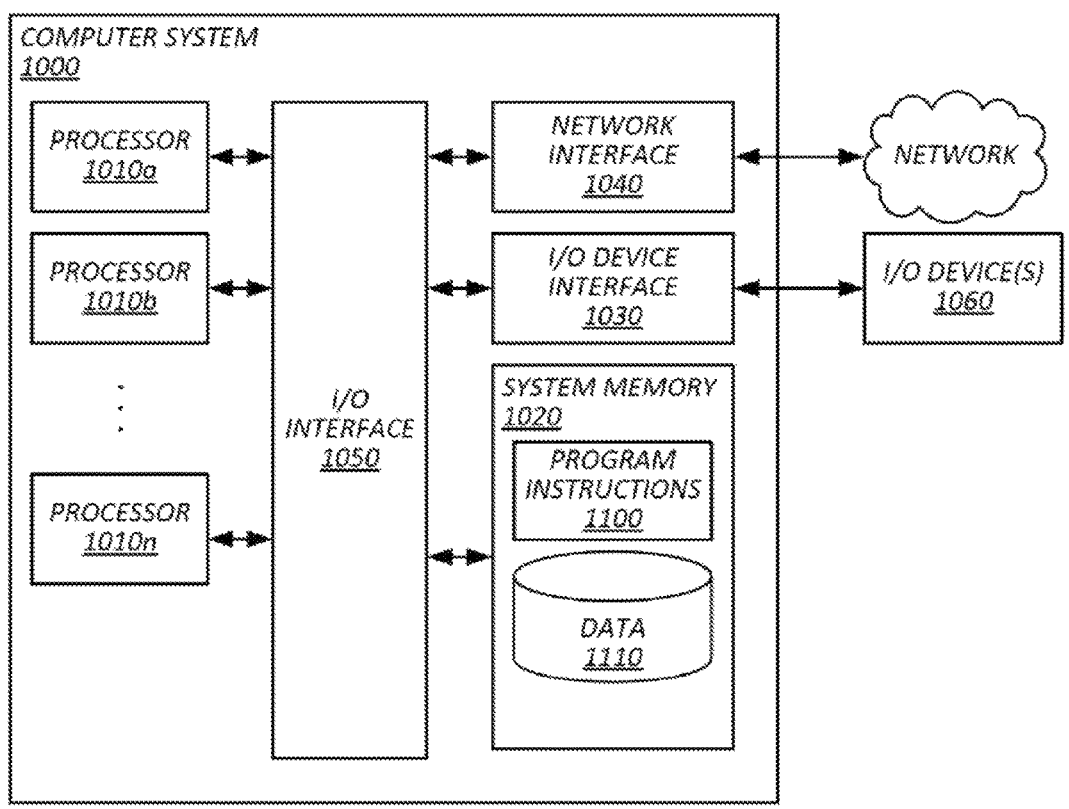
FIG. 3 illustrates components of a computing device in accordance with embodiments of the present technique.

FIG. 3 is a diagram that illustrates an exemplary computing system 1000 in accordance with embodiments of the present technique. In some cases, the above-described patch panels may connect a plurality of instance s of system 1000. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010a-1010n) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010a), or a multi-processor system including any number of suitable processors (e.g., 1010a-1010n). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface may 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device or a plurality of memory devices (e.g., distributed memory devices).

I/O interface 1050 may be configured to coordinate I/O traffic between processors 1010a-1010n, system memory 1020, network interface 1040, I/O devices 1060, or other peripheral devices. I/O interface 1050 may perform protocol, timing, or other data transformations to convert data signals from one component (e.g., system memory 1020)

into a format suitable for use by another component (e.g., processors 1010*a*-1010*n*). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present invention may be practiced with other computer system configurations.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present techniques will be better understood with reference to the following enumerated embodiments:

1. A patch panel, comprising: a circuit board; a plurality of pairs of QSFP+ sockets connected to one another via conductive traces of the circuit board; and one or more microcontrollers coupled to at least two of the conductive traces of each pair of QSFP+ sockets, wherein the one or more microcontrollers comprise memory storing instructions that when executed cause the one or more microcontrollers to perform operations comprising: obtaining configuration settings for the QSFP+ sockets; and configuring connections of the QSFP+ sockets based on the configuration settings.

2. The patch panel of embodiment 1, comprising a data connection between the one or more microcontrollers and the QSFP+ sockets that consists essentially of: a serial data line; and a serial clock line, wherein the serial data line and serial clock line constitute a bus configured for multiple master devices and multiple slave devices.

3. The patch panel of any of embodiments 1-2, wherein the operations comprise: obtaining temperature of a given QSFP+ transceiver; comparing the obtained temperature to a threshold temperature value to determining whether the obtained temperature is above the threshold temperature value; and in response to determining that the threshold temperature value is exceeded, emitting or logging an alarm.

4. The patch panel of any of embodiments 1-3, the operations comprising: obtaining a first configuration setting; and configuring at least one of the QSFP+ sockets for a 1 by 40 gigabit per second connection based on the first configuration setting.

5. The patch panel of embodiment 4, the operations comprising: obtaining a second configuration setting; and configuring at least one of the QSFP+ sockets for a 4×10 gigabit per second connection based on the second configuration setting.

6. The patch panel of any of embodiments 1-5, wherein the configuration settings are received from a rack controller.

7. The patch panel of any of embodiments 1-6, wherein the configuration settings are received from one or more jumpers.

8. The patch panel of any of embodiments 1-7, wherein the operations comprise: reading a sensor metric from a register of a given QSFP+ transceiver; storing the sensor reading in a different address of memory of the QSFP+ transceiver; more than one day after storing the sensor reading, reading the sensor metric from the different address and comparing to a current value of the register to determine whether a difference between the readings exceeds a threshold; and in response to determining that the threshold is exceeded, emitting or logging an alarm.

9. The patch panel of any of embodiments 1-8, wherein the operations comprise: writing a value to a memory address of a given QSFP+ transceiver; and more than one day after writing the value, reading the value from the memory address; and determining, based on the read value, an amount of usage.

10. The patch panel of any of embodiments 1-9, wherein the one or more microcontrollers are configured to predict a fault indicating a failure of a component, and generate an alert responsive the predicted fault.

11. The patch panel of any of embodiments 1-10, the operations comprising: detecting a fault, the fault indicating a failure of a component; and in response to detecting the fault, sending a message to a rack controller indicating a location of the failed component.

12. The patch panel of any of embodiments 1-11, the operations comprising: reading QSFP+ transceiver identifiers from memory; and sending data indicative of a patch panel graph based on the transceiver identifiers indicating connections implemented by the patch panel.

13. A patch panel of any of embodiments 1-12, comprising: a rack comprising: a plurality of computing devices connected via the patch panel, the plurality of computing devices storing in memory an operating system and an application.

14. The patch panel of any of embodiments 1-13, comprising: a first microcontroller coupled to a first pair of QSFP+ sockets; and a second microcontroller coupled to a second pair of QSFP+ sockets.

15. The patch panel of any of embodiments 1-14, the operations comprising: reading a value indicative of transceiver temperature from a register of an EEPROM associated with a QSFP+ socket; and based on the value, sending a signal to a rack controller that causes the rack controller to adjust a fan speed.

16. The patch panel of any of embodiments 1-15, wherein the operations comprising: periodically incrementing or decrementing a value in memory of the QSFP+ sockets to indicate usage.

17. The patch panel of any of embodiments 1-16, comprising at least 8 pairs of QSFP+ sockets arrayed in spaced relation.

18. The patch panel of any of embodiments 1-17, wherein the patch panel is configured to fit in N 19-inch U's of a rack, where N is an integer.

19. The patch panel of any of embodiments 1-18, the operations comprising: performing steps for monitoring a transceiver associated with one of the QFSP+ sockets.

20. The patch panel of any of embodiments 1-19, the operations comprising: reading, at a first time, a register of a transceiver associated with one of the QFSP+ sockets to obtain a first value, the register storing a value indicative of laser bias; reading, at a second time after the first time, the register of the transceiver to obtain a second value; determining a difference between the first value and the second value to determine a drift in laser bias; and determining that the drift exceeds a threshold and, in response, emitting or logging an alarm.

What is claimed is:

1. A patch panel, comprising:
a circuit board;
a plurality of pairs of QSFP+ sockets connected to one another via conductive traces of the circuit board; and
one or more microcontrollers coupled to at least two of the conductive traces of each pair of QSFP+ sockets, wherein the one or more microcontrollers comprise memory storing instructions that when executed cause the one or more microcontrollers to perform operations comprising:
obtaining configuration settings for the QSFP+ sockets;

configuring connections of the QSFP+ sockets based on the configuration settings;
writing a value to a memory address of a given QSFP+ transceiver;
more than one day after writing the value, reading the value from the memory address; and
determining, based on the read value, an amount of usage.

2. The patch panel of claim 1, comprising a data connection between the one or more microcontrollers and the QSFP+ sockets that consists essentially of:
a serial data line; and
a serial clock line, wherein the serial data line and serial clock line constitute a bus configured for multiple master devices and multiple slave devices.

3. The patch panel of claim 1, wherein the operations comprise of:
obtaining temperature of a given QSFP+ transceiver;
comparing the obtained temperature to a threshold temperature value to determining whether the obtained temperature is above the threshold temperature value; and
in response to determining that the threshold temperature value is exceeded, emitting or logging an alarm.

4. The patch panel of claim 1, the operations comprising:
obtaining a first configuration setting; and
configuring at least one of the QSFP+ sockets for a 1 by 40 gigabit per second connection based on the first configuration setting.

5. The patch panel of claim 4, the operations comprising:
obtaining a second configuration setting; and
configuring at least one of the QSFP+ sockets for a 4×10 gigabit per second connection based on the second configuration setting.

6. The patch panel of claim 1, wherein the configuration settings are received from a rack controller.

7. The patch panel of claim 1, wherein the configuration settings are received from one or more jumpers.

8. The patch panel of claim 1, wherein the operations comprise:
reading a sensor metric from a register of a given QSFP+ transceiver;
storing the sensor reading in a different address of memory of the QSFP+ transceiver;
more than one day after storing the sensor reading, reading the sensor metric from the different address and comparing to a current value of the register to determine whether a difference between the readings exceeds a threshold; and
in response to determining that the threshold is exceeded, emitting or logging an alarm.

9. The patch panel of claim 1, wherein the one or more microcontrollers are configured to predict a fault indicating a failure of a component, and generate an alert responsive the predicted fault.

10. The patch panel of claim 1, the operations comprising:
detecting a fault, the fault indicating a failure of a component; and
in response to detecting the fault, sending a message to a rack controller indicating a location of the failed component.

11. The patch panel of claim 1, the operations comprising:
reading QSFP+ transceiver identifiers from memory; and
sending data indicative of a patch panel graph based on the transceiver identifiers indicating connections implemented by the patch panel.

12. The patch panel of claim 1, comprising:
a rack comprising:
a plurality of computing devices connected via the patch panel, the plurality of computing devices storing in memory an operating system and an application.

13. The patch panel of claim 1, comprising:
a first microcontroller coupled to a first pair of QSFP+ sockets; and
a second microcontroller coupled to a second pair of QSFP+ sockets.

14. The patch panel of claim 1, the operations comprising:
reading a value indicative of transceiver temperature from a register of an EEPROM associated with a QSFP+ socket; and
based on the value, sending a signal to a rack controller that causes the rack controller to adjust a fan speed.

15. The patch panel of claim 1, wherein the operations comprising:
periodically incrementing or decrementing a value in memory of the QSFP+ sockets to indicate usage.

16. The patch panel of claim 1, comprising at least 8 pairs of QSFP+ sockets arrayed in spaced relation.

17. The patch panel of claim 1, wherein the patch panel is configured to fit in N 19-inch U's of a rack, where N is an integer.

18. The patch panel of claim 1, the operations comprising:
performing steps for monitoring a transceiver associated with one of the QFSP+ sockets.

19. The patch panel of claim 1, the operations comprising:
reading, at a first time, a register of a transceiver associated with one of the QFSP+ sockets to obtain a first value, the register storing a value indicative of laser bias;
reading, at a second time after the first time, the register of the transceiver to obtain a second value;
determining a difference between the first value and the second value to determine a drift in laser bias; and
determining that the drift exceeds a threshold and, in response, emitting or logging an alarm.

20. A patch panel, comprising:
a circuit board;
a plurality of pairs of QSFP+ sockets connected to one another via conductive traces of the circuit board;
a data connection between the one or more microcontrollers and the QSFP+ sockets that consists essentially of:
a serial data line; and
a serial clock line, wherein the serial data line and serial clock line constitute a bus configured for multiple master devices and multiple slave devices; and
one or more microcontrollers coupled to at least two of the conductive traces of each pair of QSFP+ sockets, wherein the one or more microcontrollers comprise memory storing instructions that when executed cause the one or more microcontrollers to perform operations comprising:
obtaining configuration settings for the QSFP+ sockets; and
configuring connections of the QSFP+ sockets based on the configuration settings.

21. A patch panel, comprising:
a circuit board;
a plurality of pairs of QSFP+ sockets connected to one another via conductive traces of the circuit board; and one or more microcontrollers coupled to at least two of the conductive traces of each pair of QSFP+ sockets, wherein the one or more microcontrollers comprise memory storing instructions that when executed cause the one or more microcontrollers to perform operations comprising:

obtaining configuration settings for the QSFP+ sockets;

configuring connections of the QSFP+ sockets based on the configuration settings;

reading a sensor metric from a register of a given QSFP+ transceiver;

storing the sensor reading in a different address of memory of the QSFP+ transceiver;

more than one day after storing the sensor reading, reading the sensor metric from the different address and comparing to a current value of the register to determine whether a difference between the readings exceeds a threshold; and in response to determining that the threshold is exceeded, emitting or logging an alarm.

22. A patch panel, comprising:

a circuit board;

a plurality of pairs of QSFP+ sockets connected to one another via conductive traces of the circuit board; and one or more microcontrollers coupled to at least two of the conductive traces of each pair of QSFP+ sockets, wherein the one or more microcontrollers comprise memory storing instructions that when executed cause the one or more microcontrollers to perform operations comprising:

obtaining configuration settings for the QSFP+ sockets;

configuring connections of the QSFP+ sockets based on the configuration settings; and periodically incrementing or decrementing a value in memory of the QSFP+ sockets to indicate usage.

23. A patch panel, comprising:

a circuit board;

a plurality of pairs of QSFP+ sockets connected to one another via conductive traces of the circuit board; and one or more microcontrollers coupled to at least two of the conductive traces of each pair of QSFP+ sockets, wherein the one or more microcontrollers comprise memory storing instructions that when executed cause the one or more microcontrollers to perform operations comprising:

obtaining configuration settings for the QSFP+ sockets;

configuring connections of the QSFP+ sockets based on the configuration settings;

reading, at a first time, a register of a transceiver associated with one of the QFSP+ sockets to obtain a first value, the register storing a value indicative of laser bias;

reading, at a second time after the first time, the register of the transceiver to obtain a second value;

determining a difference between the first value and the second value to determine a drift in laser bias; and determining that the drift exceeds a threshold and, in response, emitting or logging an alarm.

* * * * *